(12) United States Patent
Chung et al.

(10) Patent No.: US 7,303,995 B2
(45) Date of Patent: *Dec. 4, 2007

(54) METHOD FOR REDUCING DIMENSIONS BETWEEN PATTERNS ON A PHOTORESIST

(75) Inventors: Henry Wei-Ming Chung, Hsinchu (TW); Shin-Yi Tsai, Hsinchu (TW); Ming-Chung Liang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 394 days.

This patent is subject to a terminal disclaimer.

(21) Appl. No.: 10/465,850

(22) Filed: Jun. 20, 2003

(65) Prior Publication Data

US 2003/0216051 A1    Nov. 20, 2003

Related U.S. Application Data

(63) Continuation-in-part of application No. 09/978,546, filed on Oct. 18, 2001, now Pat. No. 6,750,150.

(60) Provisional application No. 60/390,183, filed on Jun. 21, 2002.

(51) Int. Cl.
*H01L 21/311* (2006.01)
*H01L 21/302* (2006.01)

(52) U.S. Cl. ............... 438/703; 438/751; 257/E21.215; 257/E21.316

(58) Field of Classification Search ............... 438/701, 438/702, 706, 723, 696, 711, 697, 703, 751; 257/E21.215, E21.218, E21.222, E21.316, 257/E21.245

See application file for complete search history.

(56) References Cited

U.S. PATENT DOCUMENTS 6,669,858 B2 * 12/2003 Bjorkman et al. ............ 216/72
6,750,150 B2 *  6/2004 Chung et al. ................ 438/706
6,770,567 B2 *  8/2004 Ko et al. ..................... 438/711

* cited by examiner

*Primary Examiner*—Howard Weiss
*Assistant Examiner*—(Vikki) Hoa B Trinh
(74) *Attorney, Agent, or Firm*—Akin Grump Strauss Hauer & Feld LLP

(57) ABSTRACT

A semiconductor manufacturing method that includes providing a substrate, providing a layer of material over the substrate, providing a layer of photoresist over the material layer, patterning and defining the photoresist layer, depositing a layer of polymer over the patterned and defined photoresist layer, wherein the layer of polymer is conformal and photo-insensitive, and etching the layer of polymer and the layer of material.

13 Claims, 2 Drawing Sheets

METHOD FOR REDUCING DIMENSIONS BETWEEN PATTERNS ON A PHOTORESIST

RELATED APPLICATION

This application is a continuation-in-part application of U.S. application Ser. No. 09/978,546, entitled "Method for Reducing Dimensions Between Patterns on a Photoresist," filed on Oct. 18, 2001 now U.S. Pat. No. 6,750,150, and claims priority to U.S. Provisional Application Ser. No. 60/390,183, entitled "Sub-90 nm Space and Hole Patterning Using 248 nm Lithography with Plasma-Polymerization Coating," filed on Jun. 21, 2002. This application is also related to concurrently-filed U.S. application Ser. No. 10/456,852 entitled "Method for Reducing Dimensions Between Patterns on a Hardmask," and U.S. application Ser. No. 10/465,848 entitled "Method for Reducing Dimensions Between Patterns on a Photomask." These related applications are expressly incorporated herein by reference.

DESCRIPTION OF THE INVENTION

1. Field of the Invention

This invention relates in general to a semiconductor manufacturing process and, more particularly, to a photolithographic method having reduced dimensions between patterns on a photoresist.

2. Background of the Invention

With sub-micron semiconductor manufacturing process being the prevalent technology, the demand for a high-resolution photolithographic process has increased. The resolution of a conventional photolithographic method is primarily dependent upon the wavelength of a light source, which dictates that there be a certain fixed distance between patterns on a photoresist. Distance separating patterns smaller than the wavelength of the light source could not be accurately patterned and defined.

Prior art light sources with lower wavelengths are normally used in a high-resolution photolithographic process. In addition, the depth of focus of a high-resolution photolithographic process is shallower compared to a relative low-resolution photolithographic process. As a result, a photoresist layer having a lower thickness is required for conventional photolithographic methods. However, a photoresist layer having a lower thickness is susceptible to the subsequent etching steps in a semiconductor manufacturing process. This relative ineffective resistance to etching reduces the precision of patterning and defining of a photoresist. These limitations prevent the dimensions of patterns on a photoresist from being reduced.

It is accordingly a primary object of the invention to provide a method for reducing the distance separating patterns on a photoresist layer. In addition, it is another object of the invention to provide a method to enhance the etching resistance of a patterned photoresist layer.

SUMMARY OF THE INVENTION

In accordance with the present invention, there is provided a semiconductor manufacturing method that includes defining a substrate, providing a layer of material over the substrate, providing a layer of photoresist over the layer of semiconductor material, patterning and defining the photoresist layer to form at least two photoresist structures, wherein each of the photoresist structures includes substantially vertical sidewalls and a substantially horizontal top, and wherein the photoresist structures are separated by a space, depositing a layer of polymer on the tops of the photoresist structures and the space separating the photoresist structures, wherein an amount of the polymer deposited on the tops of the photoresist structures is less than an amount of the polymer deposited on the sidewalls of the photoresist structures, and etching the polymer layer on the tops of the photoresist structures and the in space between the photoresist structures, and the layer of semiconductor material.

In one aspect, the step of depositing a layer of polymer is performed at a temperature lower than a stability temperature of the patterned and defined photoresist layer.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Reference will now be made in detail to the exemplary embodiments of the invention, examples of which are illustrated in the accompanying drawings. Wherever possible, the same reference numbers will be used throughout the drawings to refer to the same or like parts.

Figure 1:
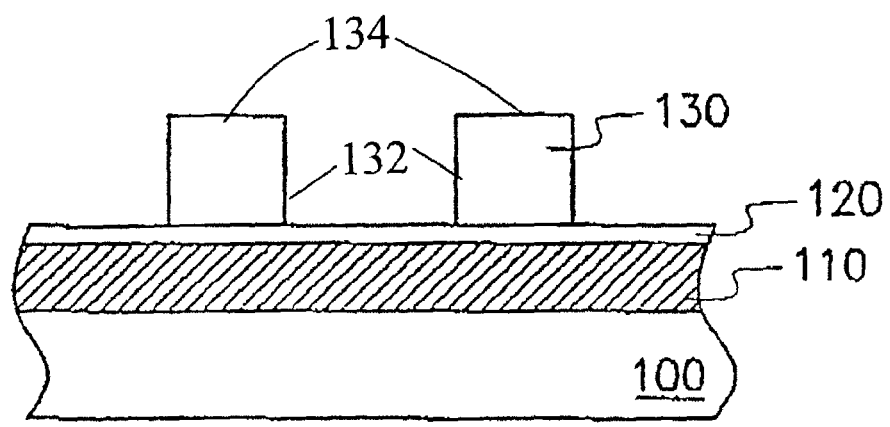
FIGS. 1-3B are cross-sectional views of the semiconductor manufacturing process steps of the present invention.

FIGS. 1-3B are cross-sectional views of the semiconductor manufacturing process steps of the present invention. Referring to FIG. 1, the method of the present invention begins by defining a wafer substrate 100. Wafer substrate 100 may be of any known semiconductor substrate material, such as silicon. A first layer 110 is then provided over wafer substrate 100. In one embodiment, first layer 110 is a semiconductor material, such as polysilicon. First layer 110 may also be a dielectric layer or a metal layer. First layer 110 may be deposited over wafer substrate 100 by any known deposition process. In another embodiment, first layer 110 is a dielectric material, in which case first layer 110 may be deposited or grown over wafer substrate 100.

An anti-reflection coating (ARC) layer 120 may optionally be provided over first layer 110 to decrease the reflection from first layer 110 in the subsequent manufacturing steps. A photoresist layer 130 is then provided over ARC layer 120. In an embodiment in which an ARC layer is not provided, photoresist layer 130 is deposited over first layer 110. Photoresist layer 130 is then patterned and defined using a known photolithographic process to form a patterned and defined photoresist layer having a plurality of photoresist structures 130. Photoresist structures 130 include substantially vertical sidewalls 132 and substantially horizontal tops 134. When first layer 110 is a semiconductor material, photoresist structures 130 function as masks to form conductors from first layer 110.

Figure 2:
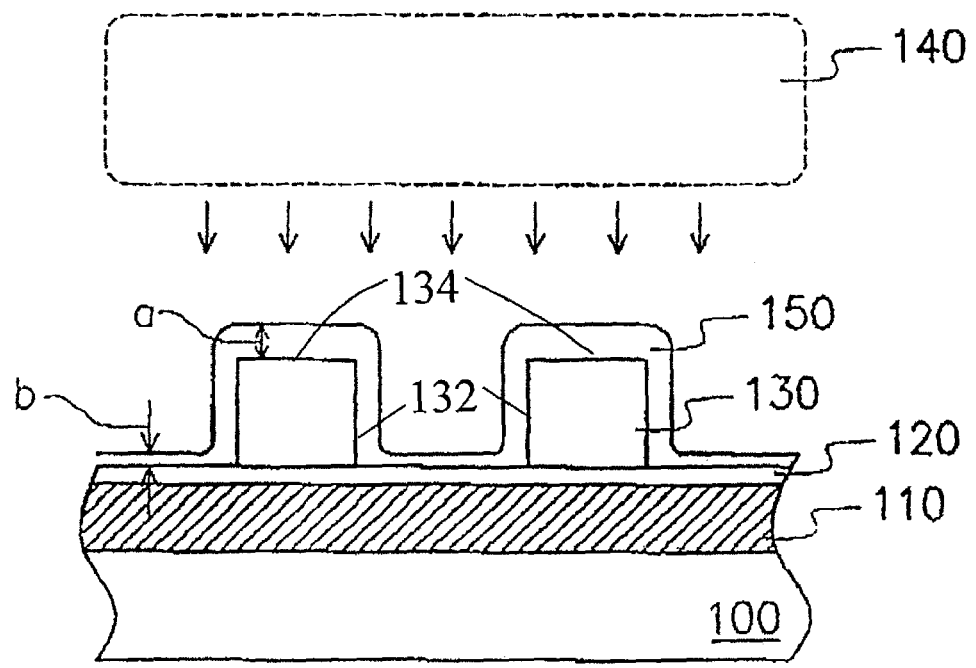

Referring to FIG. 2, a second layer 150 is deposited over patterned and defined photoresist layer 130 by a known chemical vapor deposition apparatus 140. Known chemical vapor deposition processes include plasma enhanced chemical vapor deposition (PECVD) and low pressure chemical vapor deposition (LPCVD). Second layer 150 may be organic or inorganic, and is photo-insensitive. In one embodiment, second layer 150 is a polymer layer. In another embodiment, second layer 150 is substantially conformal, covering both tops 134 and sidewalls 132 of photoresist structures 130. In addition, the step of depositing second layer 150 is performed at a temperature lower than the stability temperature of photoresist structures 130. In other words, second layer 150 is deposited at a temperature not affecting the structural stability of photoresist structures 130.

After the deposition of second layer 150, the space between photoresist structures 130 is decreased, for example, from 0.22 microns to 0.02 microns.

In the PECVD process, the pressure used is in the range of approximately 5 mTorr to 30 mTorr. The source power ranges from approximately 900 watts to 1800 watts and the bias power ranges from 0 to 1300 W. The deposition rate is between approximately 3,000 Å per minute and 6,000 Å per minute. In addition, polymer layer 150 comprises at least one hydrocarbon partially substituted by fluorine, the source for forming polymers. The partially-substituted hydrocarbons may be chosen from difluoromethane ($CH_2F_2$), a mixture of difluoromethane and octafluorobutene ($C_4F_8$), and a mixture of difluoromethane and trifluoromethane ($CHF_3$). In one embodiment, when the partially-substituted hydrocarbons include $CH_2F_2$ only, the thickness "a" of a portion of the polymer layer 150 is the same as the thickness "b" of another portion of the polymer layer 150.

Moreover, argon (Ar) and carbon monoxide (CO) may be mixed with the gases introduced during the PECVD process. Argon acts as a carrier to enhance etch uniformity of photoresist layer 130 and ARC layer 120. The function of carbon monoxide is to capture fluorine radicals and fluoride ions generated by the fluoro-substituted hydrocarbons. As such, etching of the polymers during the deposition process is prevented, thereby enhancing the deposition rate of polymer layer 150. Oxygen ($O_2$) and nitrogen ($N_2$) gases also can be added to the PECVD process. Contrary to the function of the carbon monoxide, the presence of oxygen serves to etch polymer layer 150. Therefore, the deposition rate of polymer layer 150 can be controlled. Also, perfluorohydrocarbons, such as hexafluoroethane ($C_2F_6$) and tetrafluoromethane ($CF_4$), can be mixed with the gases combined with the plasma during deposition because these gases, similar to the oxygen gas, etch polymer layer 150.

In one embodiment, when the gases used during deposition of second layer 150 include approximately 10 to 30 sccm of $C_4F_8$, 10 to 30 sccm of $CH_2F_2$, 50 to 150 sccm of CO, and 100 to 300 sccm of argon (Ar), the amount of second layer 150 deposited on tops 134 of the photoresist structures 130 is substantially greater than the amount adhered to sidewalls 132. In another embodiment, when the gases used during deposition of second layer 150 include approximately 10 to 30 sccm of $C_4F_8$, 0 to 15 sccm of $CH_2F_2$, 0 to 50 sccm of CO, and 100 to 300 sccm of argon (Ar), and the bias power is greater than approximately 400 W, the amount of second layer 150 deposited on tops 134 of photoresist structures 130 is substantially less than the amount adhered to sidewalls 132.

Figure 3A:
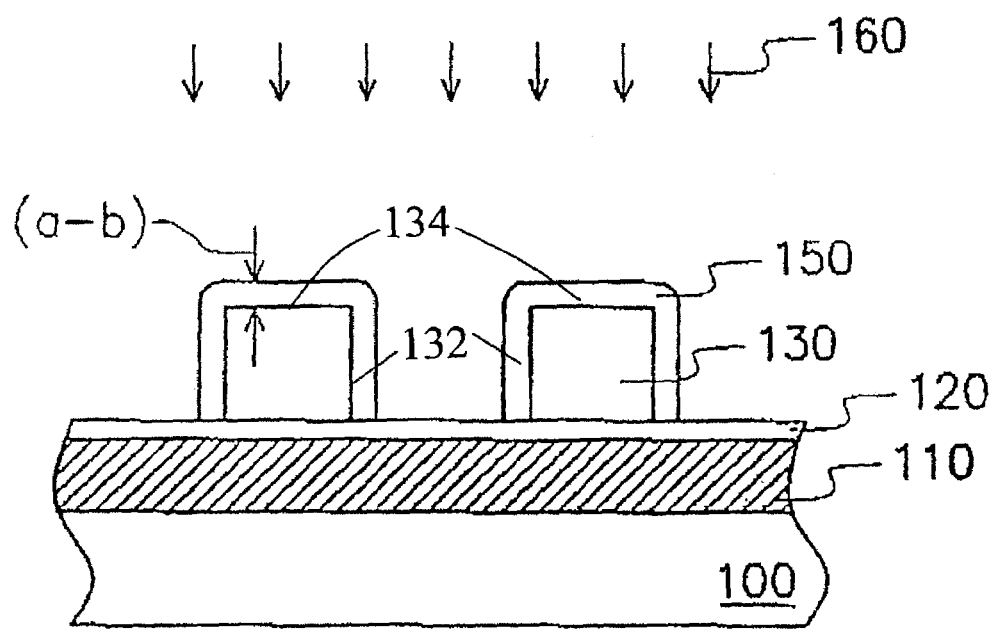
Figure 3B:
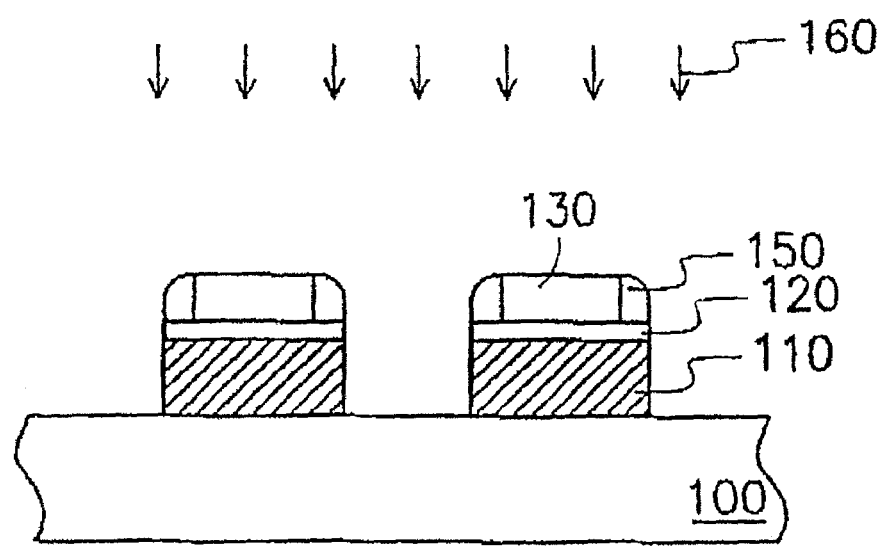

Referring to FIGS. 3A and 3B, second layer 150, photoresist structures 130, ARC layer 120, and first layer 110 are etched anisotropically with a plasma-based dry etching process. The dry etching process uses plasma 160 as etchant. In an embodiment in which "a" is thicker than "b," the thickness of second layer 150 changes from "a" to "a-b" after second layer 150 deposited over ARC layer 120 is completely etched away. This shows that second layer 150 provides excellent resistance to the plasma etch process and therefore enhances the etching resistance of photoresist structures 130.

As shown in FIG. 3B, when the anisotropic dry etching process continues, second layer 150 acts as an etch stop and remains on sidewalls 132 of photoresist structures 130. Thus, the dimensions between the patterned photoresist and underlying patterned first layer 110 are reduced. Photoresist structures 130 may be removed using any conventional process.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor manufacturing method, comprising:
   defining a substrate; providing a layer of material over the substrate;
   providing a layer of photoresist over the layer of material;
   patterning and defining the photoresist layer to form at least two photoresist structures, wherein each of the photoresist structures includes substantially vertical sidewalls and a substantially horizontal top, and wherein the photoresist structures are separated by a space;
   depositing a layer of polymer on the tops of the photoresist structures and the space separating the photoresist structures, wherein an amount of the polymer deposited on the tops of the photoresist structures is less than an amount of the polymer deposited on the sidewalls of the photoresist structures; and
   etching the polymer layer on the tops of the photoresist structures and in the space between the photoresist structures, and the layer of material.

2. The method as claimed in claim 1, wherein the step of depositing a layer of polymer is performed at a temperature lower than a stability temperature of the patterned and defined photoresist layer.

3. The method as claimed in claim 1, wherein the layer of polymer is deposited with plasma enhanced chemical vapor deposition at a pressure of between approximately 5 mTorr to 30 mTorr.

4. The method as claimed in claim 1, wherein the layer of polymer is deposited with plasma enhanced chemical vapor deposition at a rate of between approximately 3000 Å per minute and 6000 Å per minute.

5. The method as claimed in claim 1, wherein the layer of polymer is deposited with plasma enhanced chemical vapor deposition using a mixture of gases that include approximately 10 to 30 sccm of $C_4F_8$.

6. The method as claimed in claim 1, wherein the layer of polymer is deposited with plasma enhanced chemical vapor deposition using a mixture of gases that include approximately 0 to 15 sccm of $CH_2F_2$.

7. The method as claimed in claim 1, wherein the layer of polymer is deposited with plasma enhanced chemical vapor deposition using a mixture of gases that include approximately 0 to 50 sccm of CO.

8. The method as claimed in claim 1, wherein the layer of polymer is deposited with plasma enhanced chemical vapor deposition using a mixture of gases that include approximately 100 to 300 sccm of argon.

9. The method as claimed in claim 1, wherein the layer of polymer is deposited with plasma enhanced chemical vapor deposition using a mixture of gases at a bias power greater than approximately 400 W.

10. The method as claimed in claim 1 further comprising a step of depositing an anti-reflection coating over the layer of material.

11. The method as claimed in claim 1, wherein the layer of material is selected from the group consisting of polysilicon, dielectric material and metallic material.

12. The method as claimed in claim 1, further comprising a step of removing the layer of polymer and the photoresist structures.

13. The method as claimed in claim 1, wherein the layer of polymer is substantially conformal.

* * * * *